(12) United States Patent
Lee et al.

(10) Patent No.: US 7,110,261 B2
(45) Date of Patent: Sep. 19, 2006

(54) HEAT DISSIPATION ASSEMBLY

(75) Inventors: Hsieh Kun Lee, Tu-Chen (TW); Cheng-Tien Lai, Tu-Chen (TW); Shi-Wen Zhou, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 170 days.

(21) Appl. No.: 10/946,663

(22) Filed: Sep. 21, 2004

(65) Prior Publication Data
US 2005/0111197 A1    May 26, 2005

(30) Foreign Application Priority Data
Nov. 21, 2003    (CN)    ............... 2003 2 0118519 U

(51) Int. Cl.
*H05K 7/20* (2006.01)
(52) U.S. Cl. ............ 361/704; 361/719; 257/718; 257/727; 174/16.1; 165/80.3; 165/185
(58) Field of Classification Search ............... 361/704, 361/719; 257/718, 727; 174/16.1; 165/80.3, 165/185; 24/453
See application file for complete search history.

(56) References Cited

U.S. PATENT DOCUMENTS 6,307,748 B1 * 10/2001 Lin et al. .................. 361/704
6,475,030 B1 * 11/2002 Chang ..................... 439/557
2003/0217835 A1 * 11/2003 Lee ......................... 165/80.3
2005/0141201 A1 *  6/2005 Chen et al. ................ 361/704

FOREIGN PATENT DOCUMENTS

| TW | 410992 | 11/2000 |
|----|--------|---------|
| TW | 454899 | 9/2001  |
| TW | 461696 | 10/2001 |
| TW | 465805 | 11/2001 |
| TW | 468814 | 12/2001 |

* cited by examiner

*Primary Examiner*—Boris Chervinsky
(74) *Attorney, Agent, or Firm*—Wei Te Chung

(57) ABSTRACT

A heat dissipation assembly of the present invention includes a printed circuit board (50), an electronic component (60) mounted on the printed circuit board, a heat dissipation device (70) mounted on the electronic component, four securing members (10) secured to the heat dissipation device and four positioning members (20) extend through the printed circuit board. The positioning members are covered over by four resilient members (30) disposed in the securing members. The positioning members pull the securing members toward the printed circuit board.

14 Claims, 2 Drawing Sheets

US 7,110,261 B2

HEAT DISSIPATION ASSEMBLY

BACKGROUND OF THE INVENTION

1. Field of the Invention

The present invention relates to heat dissipation assemblies, and more particularly to a heat dissipation assembly removing heat from an electronic component.

2. Description of Prior Art

Numerous modem electronic components such as central processing units (CPUs) of computers generate large amounts of heat during operation. The heat must be efficiently removed from the CPU; otherwise, abnormal operation or damage may result. Typically, a heat dissipation device is mounted on the CPU to remove heat therefrom.

Mostly, holes are defined in printed circuit boards (PCBs). Screws are inserted through the heat dissipation device and engaged within the holes of the PCB to mount the heat dissipation device to the CPU. However, attachment and detachment of the screws are unduly laborious. Furthermore, the PCB is prone to be deformed due to overloaded force on partial portions thereof.

For overcoming the above-mentioned problems, metal piece clips are developed. This kind of clip commonly has a M-shaped profile. The clip comprises a central pressing portion and a pair of engaging portions extending perpendicularly from the pressing portion. The pressing portion is for pressing the heat dissipation device toward the CPU. The engaging portions are for engaging with a socket or a retention module in order to secure the heat dissipation device and render the heat dissipation device to contact the CPU. Unfortunately, tools are required to have the engaging portions engaged with the socket or the retention module. Engagement and disengagement of the clip from the socket or the retention module are still unduly laborious. Furthermore, the heat dissipation device is prone to displace relative to the CPU. This adversely affects the heat conduct capability from the CPU to the heat dissipation device.

SUMMARY OF THE INVENTION

Accordingly, an object of the present invention is to provide a heat dissipation assembly which can be easily and securely assembled.

In order to achieve the object set out above, a heat dissipation assembly in accordance with a preferred embodiment of the present invention comprises a printed circuit board, an electronic component mounted on the printed circuit board, a heat dissipation device mounted on the electronic component, four securing members secured to the heat dissipation device and four positioning members extend through the printed circuit board. The positioning members are covered over by four resilient members disposed in the securing members. The positioning members pull the securing members toward the printed circuit board. In the present invention, the positioning members relatively position the heat dissipation device parallel to the electronic component, so that displacement parallel to the electronic component is avoided for the heat dissipation device. The positioning members pull the securing members toward the printed circuit board so that the heat dissipation device can be intimately attached to the electronic component. The resilient members prevent the electronic component from being damaged during shock or vibration.

Other objects, advantages and novel features of the present invention will become more apparent from the following detailed description when taken in conjunction with the accompanying drawings, in which:

DETAILED DESCRIPTION OF THE INVENTION

Figure 1:
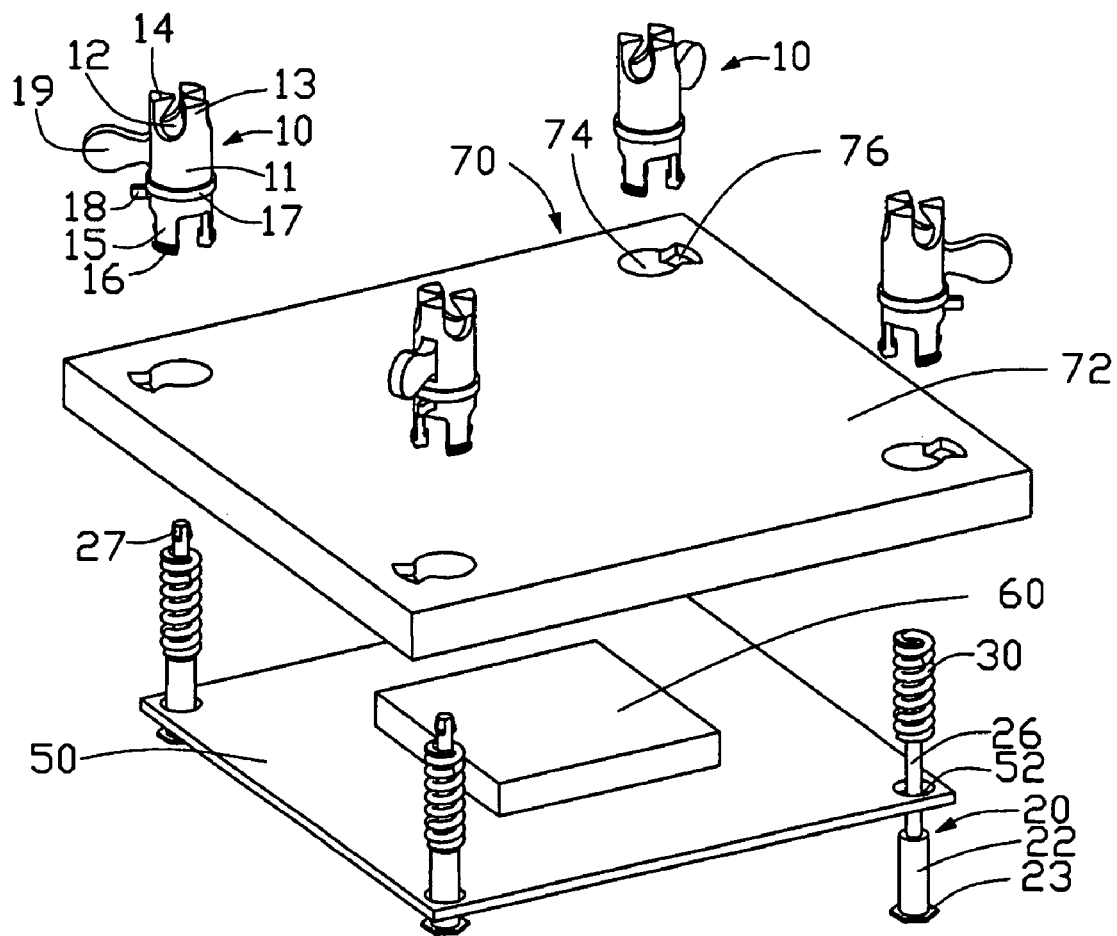
FIG. 1 is an exploded, isometric view of a heat dissipation assembly in accordance with a preferred embodiment of the present invention.
Figure 2:
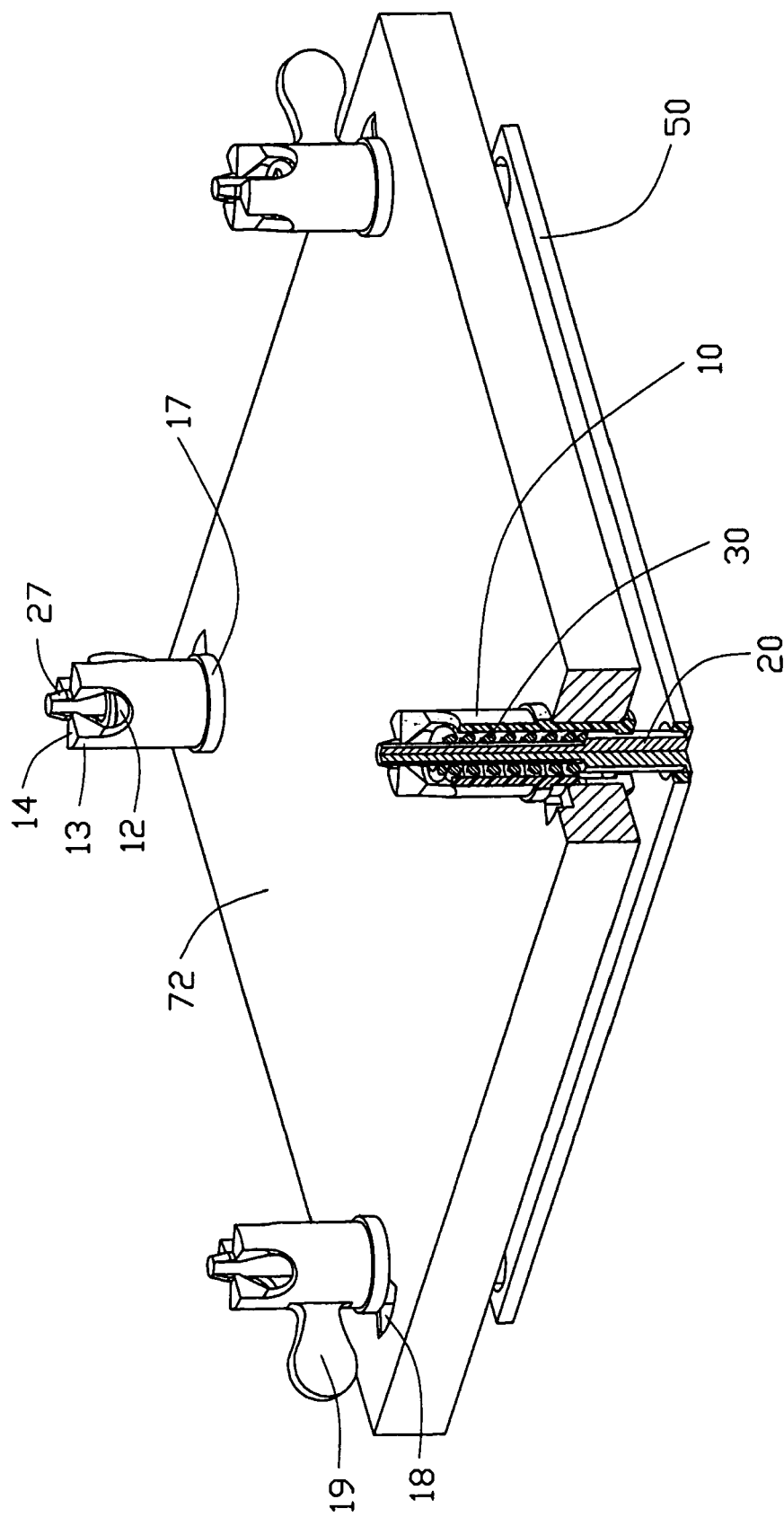
FIG. 2 is an assembled view of FIG. 1, but having part of the heat dissipation assembly cut away.

Referring to FIGS. 1–2, a heat dissipation assembly in accordance with the preferred embodiment of the present invention comprises a fastening apparatus, a PCB 50, an electronic component 60 mounted on the PCB 50 and a heat dissipation device 70 mounted on the electronic component 60 for removing heat therefrom.

The PCB 50 defines four through holes 52 therein spaced from and symmetrically around the electronic component 60. The heat dissipation device 70 has a planar base 72 defining four openings 74 therein corresponding to the through holes 52 of the PCB 50, and four dents 76 in communication with corresponding openings 74. Each dent 76 has a substantially 60 degrees sector transverse section.

The fastening apparatus comprises four securing members 10, four positioning members 20 and four resilient members 30. Each securing member 10 comprises a cylindraceous body 11 within which an axial hole 12 is defined. Three paws 13 extend from an end of the body 11 along an axial direction of the body 11. The paws 13 are separated from each other, and each form an inner tooth 14 at a distal end thereof. Three claws 15 extend from an opposite end of the body 11 along the axial direction of the body 11. The claws 15 are separated from each other, and each form an outer hook 16 at a distal end thereof. A pressing ring 17 is formed at a circumferential outer surface of the body 11. A nub 18 is formed at the body 11 between the ring 17 and the claws 15, and is also connected with the ring 17. The nub 18 is projected from the body 11 beyond from the ring 17. A handle 19 is projected from the body 11 between the ring 17 and the paws 13, for facilitating an operation of the securing member 10. The handle 19 and the nub 18 are arranged along the axial direction of the body 11.

Each positioning member 20 comprises a bottom pole 22 and a top pole 23 extending linearly from a top end of the bottom pole 22. The bottom pole 22 has a larger diameter than the top pole 26. An abutting tab 23 is perpendicularly formed at a bottom end of the bottom pole 22. Three blocks 27 are formed at a top end of the top pole 26, separate from each other. The resilient members 30 are springs in the preferred embodiment.

In assembly of the heat dissipation assembly, the claws 15 of the securing members 10 are elastically inserted through the openings 74 of the heat dissipation device 70. The claws 15 rebound to capture the base 72 of the heat dissipation device 70 with the hooks 16. The hooks 16 cooperate with the pressing rings 17 to sandwich the base 72 therebetween. Therefore, the securing members 10 are secured to the heat dissipation device 70. The nubs 18 are received in the dents 76 at extreme sides thereof respectively.

The positioning members 20 are inserted through the through holes 52 of the PCB 50. The resilient members 30 cover over the top poles 26 of the positioning members 20. The openings 74 with securing members 10 therein are aligned with the positioning members 20. The heat dissipation device 70 is then pressed toward the electronic component 60, to have the positioning members 20 inserted through the axial holes 12 of the securing members 10 and to have the blocks 27 projected from the teeth 14 of the securing members 10. When the blocks 27 slide over the teeth 14 of the securing members 10, the handles 19 are rotated from said extreme sides to opposite extreme sides of the corresponding dents 76, so that the blocks 27 of the positioning members 20 ride on the teeth 14 of the securing members 10. Thus, the heat dissipation assembly is assembled.

In the present invention, the positioning members 20 relatively position the heat dissipation device 70 parallel to the electronic component 60, so that displacement parallel to the electronic component 60 is avoided for the heat dissipation device 70. The securing members 10 are interlocked with the positioning members 20 and pulled by the positioning members 20 toward the printed circuit board 50, so that the heat dissipation device 70 can be intimately attached to the electronic component 60. The resilient members 30 prevent the electronic component 60 from being damaged during shock or vibration.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly comprising:
   a printed circuit board;
   an electronic component mounted on the printed circuit board;
   a heat dissipation device mounted on the electronic component;
   a plurality of securing members secured to the heat dissipation device; and
   a plurality of positioning members projected from the printed circuit board, the positioning members being covered over by resilient members disposed in the securing members and pulling the securing members toward the printed circuit board.

2. The heat dissipation assembly of claim 1, wherein each of the securing member comprises a pressing ring and a plurality of hooks spaced from the pressing ring, the pressing ring and the hooks sandwich the heat dissipation device therebetween.

3. The heat dissipation assembly of claim 2, wherein each of the securing member forms a handle adjacent the pressing ring for facilitating a rotation of the securing member.

4. The heat dissipation assembly of claim 1, wherein the heat dissipation device defines a plurality of openings, the securing members are inserted through the openings and rotatable relative to the heat dissipation device.

5. The heat dissipation assembly of claim 4, wherein the heat dissipation device defines a plurality of dents in communication with the openings, and the securing members each form a nub projected therefrom, the nubs being received in the dents respectively.

6. The heat dissipation assembly of claim 5, wherein each of the dents has a substantially 60 degrees sector transverse section, for controlling the rotation of the securing members.

7. The heat dissipation assembly of claim 1, wherein each of the securing members defines an axial hole, the axial holes receiving the positioning members therein.

8. The heat dissipation assembly of claim 1, wherein the positioning members each comprise a first pole section and a second pole section extending from the first pole section, the resilient members covering over the second pole sections of the positioning members.

9. The heat dissipation assembly of claim 8, wherein the first pole section has a larger diameter than the second pole section.

10. The heat dissipation assembly of claim 1, wherein the securing members each form three teeth, the positioning members each form three blocks riding on the teeth of the securing members.

11. The heat dissipation assembly of claim 1, wherein the resilient members are springs.

12. A heat dissipation assembly comprising:
    a printed circuit board;
    an electronic component mounted on the printed circuit board;
    a heat dissipation device mounted on the electronic component;
    a plurality of securing members located on the heat dissipation device; and
    a plurality of positioning members upwardly projected from the printed circuit board through the heat dissipation device and the corresponding securing members, each of the positioning members defining a locking head at an uppermost tip thereof; wherein
    said securing member defines opening and closed positions in different first and second radial directions so as to allow the locking head to enter the corresponding securing member in a free manner when said locking head is aligned with the corresponding securing member in the first radial direction, and to lock to the corresponding securing member in a locking manner when said locking head is aligned with the corresponding securing member in the second radial direction by rotating said securing member relative to the positioning member.

13. The heat dissipation assembly of claim 12, wherein a resilient member is compressed between the securing member and said positioning member.

14. The heat dissipation assembly of claim 12, wherein said positioning member is surrounded by said securing member.

* * * * *